United States Patent

Tsai

[11] Patent Number: 6,001,735
[45] Date of Patent: Dec. 14, 1999

[54] DUAL DAMASCENE TECHNIQUE

[75] Inventor: Meng-Jin Tsai, Kaohsiung, Taiwan

[73] Assignee: United Microelectronics Corp., Hsinchu, Taiwan

[21] Appl. No.: 09/110,545

[22] Filed: Jul. 6, 1998

[30] Foreign Application Priority Data

May 5, 1998 [TW] Taiwan .................................. 87106886

[51] Int. Cl.$^6$ ................................................. H01L 21/28
[52] U.S. Cl. ........................ 438/638; 438/437; 257/587
[58] Field of Search .................................... 438/637, 638, 438/639, 640, 634, 620, 622, 618, 666, 574, 631; 257/4, 587

[56] References Cited

U.S. PATENT DOCUMENTS

| | | | |
|---|---|---|---|
| 4,671,851 | 6/1987 | Beyer et al. | 156/645 |
| 4,789,648 | 12/1988 | Chow et al. | 437/225 |
| 5,169,801 | 12/1992 | Sato | 437/195 |
| 5,173,448 | 12/1992 | Yanagi | 437/186 |
| 5,246,884 | 9/1993 | Jaso et al. | 437/225 |
| 5,635,423 | 6/1997 | Huang et al. | 437/195 |
| 5,723,358 | 3/1998 | Manley | 437/60 |
| 5,789,315 | 8/1998 | Besser et al. | 438/624 |
| 5,795,823 | 8/1998 | Avanzino et al. . | |
| 5,801,094 | 9/1998 | Yew et al. . | |
| 5,814,557 | 9/1998 | Venkatraman et al. . | |
| 5,814,564 | 9/1998 | Yao et al. | 438/723 |
| 5,863,835 | 1/1999 | Yoo et al. . | |
| 5,877,075 | 3/1999 | Dai et al. . | |
| 5,882,996 | 3/1999 | Dai et al. . | |
| 5,891,799 | 4/1999 | Tsui . | |
| 5,906,911 | 5/1999 | Cote . | |

*Primary Examiner*—Charles Bowers
*Assistant Examiner*—Martin Sulsky

[57] ABSTRACT

A method of forming a dual damascene structure includes forming an oxide layer and a mask layer there on, which both have protuberances over the conductive layers. Then a chemical mechanical polishing is performed to remove the protuberances and to form openings. The protuberances are above the conductive layers.

17 Claims, 2 Drawing Sheets

DUAL DAMASCENE TECHNIQUE

CROSS-REFERENCE TO RELATED APPLICATION

This application claims the priority benefit of Taiwan application serial no. 87106886, filed May 5, 1998, the full disclosure of which is incorporated herein by reference.

BACKGROUND OF THE INVENTION

1. Field of the Invention

This invention relates to a semiconductor process, and more particularly, to a method of fabricating a dual damascene structure.

2. Description of Related Art

As the integration of the integrated circuit (IC) increases, the number of interconnection is consequently increased. Therefore, more than two layers of metal layer become necessary design for most integrated circuit. As the integration of the integrated circuit continually increases, the difficulties of forming metal inter-connections with high yield and reliability increase as well. Dual damascene technique is therefore proposed. Dual damascene technique satisfies the requirement of high yield and reliability by the process steps, including etching metal interconnection trenches in the dielectric layer and then filling metal into the trenches. As a result, dual damascene technique becomes the best choice of sub-quarter micron interconnection fabrication.

FIG. 1A to FIG. 1C illustrates the fabrication process of a conventional dual damascene. Referring to FIG. 1A, on a substrate 10, a conductive layer 14 is formed. The conductive layer 14 is used for coupling the substrate 10 to other desired structures (not shown). An inter-metal-dielectric layer 12 is also formed to prevent undesired close or coupling of the conductive layer 14 and other desired structure at undesired points.

Next, an oxide layer 16 is formed to cover the conductive layer 14 by low-pressure chemical vapor deposition (LPCVD). A mask layer 18 is then formed to cover the oxide layer 16 by LPCVD. The mask layer 18 is a silicon nitride layer usually. Using the same LPCVD, an oxide layer 20 is formed to cover the mask layer 18. Next, a photoresist layer 21 is coated to define the oxide layer 20 to expose a portion of the oxide layer 20. The exposed portion of the oxide layer 20 is corresponding to the conductive layer 14.

Referring to FIG. 1B, the exposed oxide layer 20 is etched, using conventional photolithography and etching. The etching process is continued until the mask layer 18 is etched through to form an opening 22 exposing the oxide layer 16. The photoresist layer 21 is then removed, by oxide plasma. Next, a second photoresist layer 24 is coated to further define the oxide layer 20 so that the opening 22 and a portion of the oxide layer 20, including the oxide layer at two sides of the opening 22, are exposed.

Referring to FIG. 1C, the exposed oxide layer 16 at the opening 22 is further etched, by conventional photolithography and etching, so that the mask layer 18 is further exposed. Also, a portion of the oxide layer 20 uncovered by the photoresist layer 24 and a portion of the oxide layer 20 at the periphery of the opening 22 are etched to form an opening 26 and an opening 28, respectively, exposing the mask layer 18. The opening 28 further includes the opening 22.

Next, the photoresist layer 24 is removed by oxide plasma. A conductive layer 30 is formed by sputtering or CVD to fill the opening 22 and the opening 28 to contact with the conductive layer 14 and also to fill the opening 26.

Then, several continuous processes are performed to accomplish the dual damascene structure.

However, the conventional dual damascene technique requires more than two steps of photoresist coating and photolithography so that the processes are more complicate and misalignment tends to occur.

SUMMARY OF THE INVENTION

It is therefore an objective of the present invention to provide a method of fabricating a dual damascene structure, which includes only one step of photoresist coating and photolithography. It is obvious that the dual damascene of the invention is much more simple and without the phenomenon of the misalignment.

It is another an objective of the present invention to provide a method of forming a dual damascene structure including forming an oxide layer and a mask layer there on, which both have protuberances over the conductive layers. Then a chemical mechanical polishing is performed to remove the protuberances and to form openings. The protuberances are above the conductive layers.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
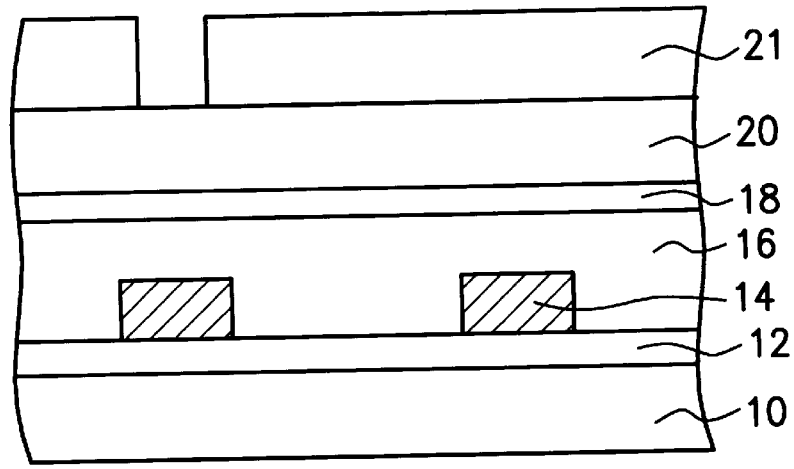
FIGS. 1A to 1C are cross-sectional views showing the conventional process steps for forming a dual damascene structure.
Figure 1B:
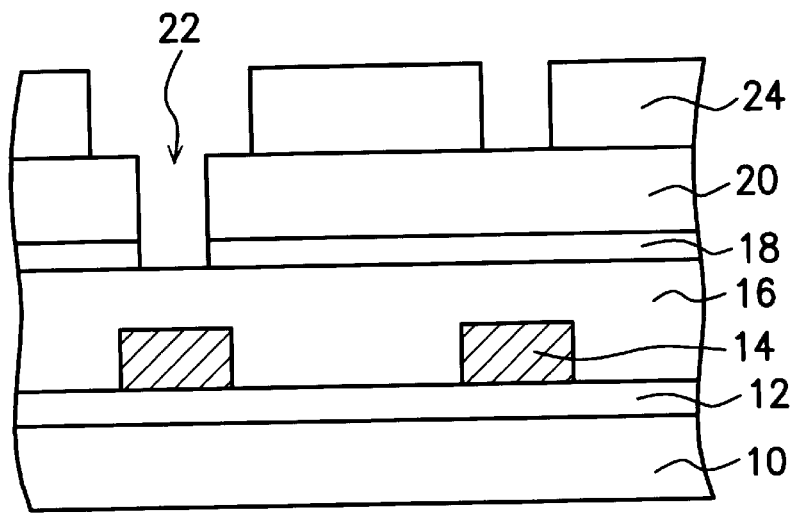
Figure 1C:
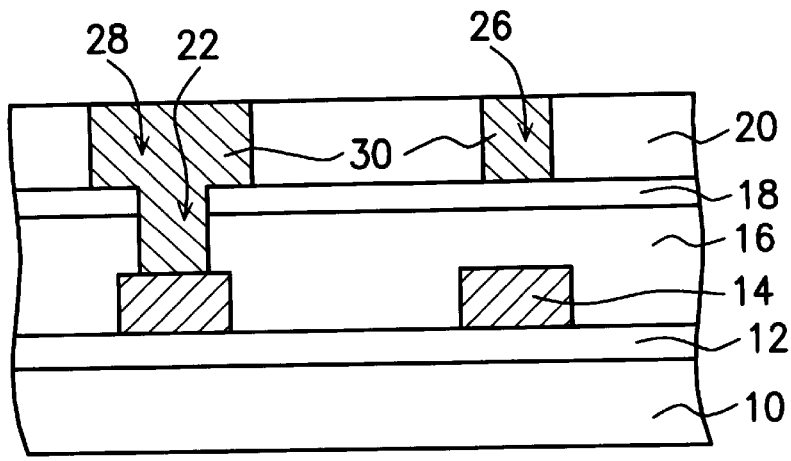
Figure 2A:
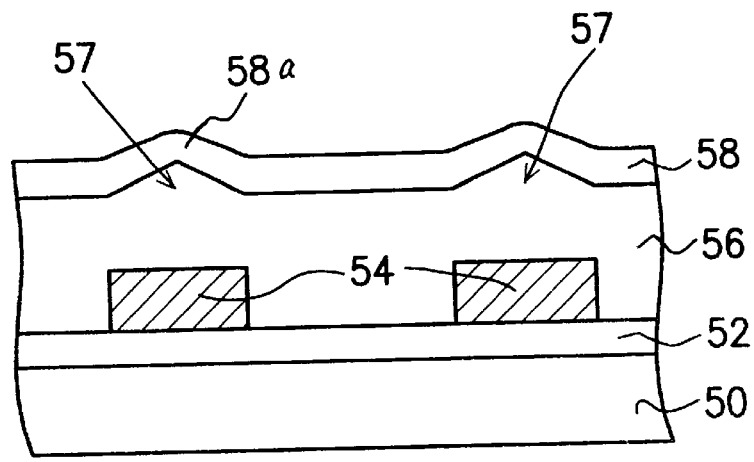
FIGS. 2A to 2C are cross-sectional views showing the process steps for forming a dual damascene structure according to a preferred embodiment of the invention.

Referring to FIG. 2A, on a substrate 50, a conductive layer 54 is formed. The conductive layer 54 is used for coupling the substrate 50 to other desired structures (not shown). An inter-metal-dielectric layer 52 is also formed to prevent undesired close or coupling of the conductive layer 54 and other desired structure at undesired points.

Next, an oxide layer 56 is formed to cover the conductive layer 54, using, for example, high-density plasma chemical vapor deposition (HDPCVD). By using HDPCVD, protuberances 57 are formed over the conductive layers 54. The protuberances 57 can be in any shape. However, the formation of the oxide layer 56 is not limited to HDPCVD but on the other hand can be formed by plasma enhanced chemical vapor deposition (PECVD). Similarly, protuberances 57 are also formed by PECVD.

Then, using, for example, low pressure chemical vapor deposition (LPCVD) to form a mask layer 58 to cover the oxide layer 56. The material of the mask layer 58 preferably includes silicon nitride or silicon oxy-nitride. The configuration of the mask layer 58 is substantially parallel to that of the oxide layer 56 so that the mask layer 58 also has protuberances 58a, accordingly.

Figure 2B:
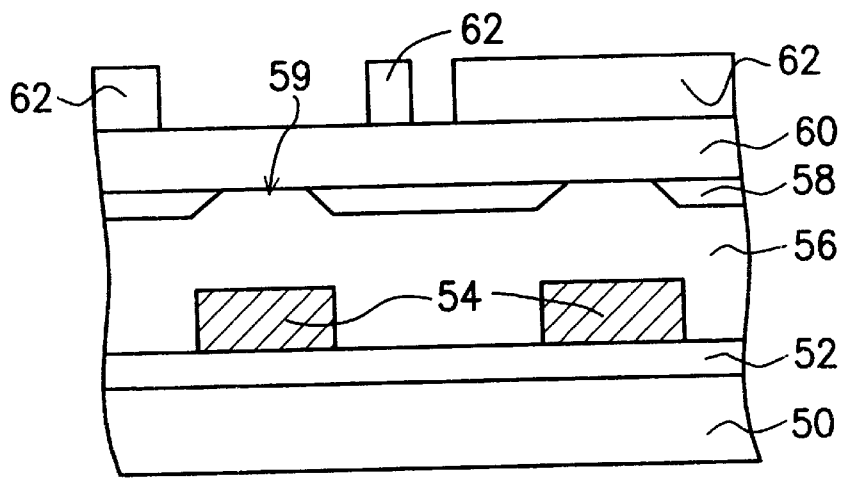
Figure 2C:
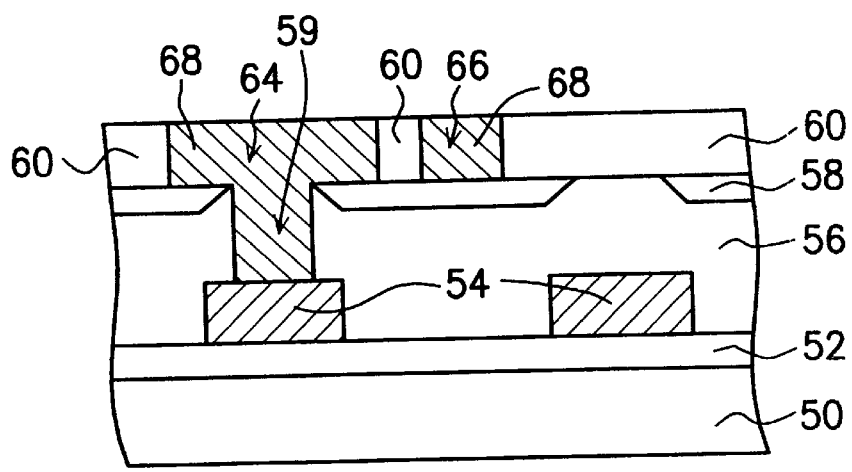

Next, referring to FIG. 2B, the protuberances 58a of the mask 58 are removed by chemical mechanical polishing (CMP) so that openings 59 are formed to expose the oxide layer 56. The remained mask layer 58 and the exposed oxide layer 56 are substantially at the same level. Then, an oxide layer 60 is formed, preferably by LPCVD, to cover the mask layer 58 and the exposed oxide layer 56.

One of the characteristics of the invention is to use chemical mechanical polishing to remove the protuberance 58a of the mask layer 58 so that openings 59 are formed. Consequently, only one step of photoresist coating and photolithography is used according to the present invention. However, at least two steps of photoresist coating and photolithography should be used according to the conventional method. Even if there are different level of protuberances between two conductive layers 54, only the protuberances with higher level, which are the protuberances above the conductive layers 54, can be polished away to form openings. Therefore, during the deposition of the other conductive layer, the conductive material can only be formed in the openings above the conductive layer 54 so that undesired close and coupling can be prevented.

A photoresist layer 62 is then coated to define the oxide layer 60. The photoresist layer 62 expose a first portion of the oxide layer 60 above the opening 59 and a second portion of the oxide layer 60 above the mask layer 58. Then, using conventional photolithography and etching steps, the oxide layer 60 is etched to form an opening 64 and an opening 66. The oxide layer 56 exposed out the opening 59 is further etched to expose the conductive layer 54 to form an opening 64.

Then, a conductive layer 68 is formed, preferrably by sputtering or CVD, to fill into the opening 59 and the opening 64 to be coupled with the conductive layer 54 and cover the exposed mask layer 58. The conductive layer 68 is also filled into the opening 66, contacting with the mask layer 58. The material of the conductive layer 68 is preferrably tungsten.

Next, several continuous process steps are performed to accomplish the fabrication of the dual damascene structure. However, these are not related to the characters of the invention so that they are not described in detail.

Consequently, the characters of the invention include using HDPCVD or PECVD to form an oxide layer 56 and then forming a mask layer to obtain protuberance structures. Next, the protuberance of the mask layer 58 is removed by CMP to form an opening 59. The dual damascene of the invention uses only one step of photoresist coating and photolithography, which is much more simple than the conventional.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A dual damascene method, comprising:

providing a substrate, wherein a plurality of first conductive layers is formed on the substrate;

forming a first oxide layer covering the first conductive layers and the substrate, wherein the first oxide layer has a protuberance over each of the first conductive layers;

forming a mask layer covering the first oxide layer so that the mask layer also has protuberances;

removing the protuberances of the mask layer to form at least a first opening exposing the first oxide layer over one of the first conductive layers;

forming a second oxide layer to cover the mask layer with the first opening;

patterning the second oxide layer and the first oxide layer to form a second opening which exposes the first opening and said one of the first conductive layers and to form a third opening through the second oxide layer, exposing the mask layer; and forming a second conductive layer in the first opening and the second opening to contact with said one of the first conductive layers and in the third opening.

2. A method of claim 1, wherein the first oxide layer is formed by high density plasma chemical vapor deposition.

3. A method of claim 1, wherein the first oxide layer is formed by plasma enhanced chemical vapor deposition.

4. A method of claim 1, wherein a material of the mask layer includes silicon nitride.

5. A method of claim 1, wherein the protuberance of the mask layer is removed by chemical mechanical polishing.

6. A method of claim 1, wherein the second oxide layer and the first oxide layer are patterned by photolithography and etching.

7. A dual damascene method, comprising:

providing a substrate, wherein a plurality of first conductive layers are formed on the substrate;

forming a first oxide layer and a mask layer successively covering the first conductive layers and the substrate, wherein each of the first oxide layer and the mask layer has a protuberance over each of the first conductive layers;

removing the protuberances of the mask layer to form at least a first opening exposing the first oxide layer over one of the first conductive layers;

forming a second oxide layer to cover the mask layer with the first opening;

patterning the second oxide layer and the first oxide layer to form a second opening which exposes the first opening and said one of the first conductive layers; and forming a second conductive layer in the first opening and the second opening to contact with said one of the first conductive layers.

8. A method of claim 7, wherein the first oxide layer is formed by high-density plasma chemical vapor deposition.

9. A method of claim 7, wherein the first oxide layer is formed by plasma enhanced chemical vapor deposition.

10. A method of claim 7, wherein a material of the mask layer includes silicon nitride.

11. A method of claim 7, wherein the protuberance of the mask layer is removed by chemical mechanical polishing.

12. A method of claim 7, wherein the second oxide layer and the first oxide layer are patterned by photolithography and etching.

13. A method of claim 7 wherein during said step of patterning the second oxide layer and the first oxide layer, a third opening is also formed through the second oxide layer to expose the mask layer.

14. A technique of claim 13, wherein in said step of forming the second conductive layer, the second conductive layer is further filled in the third opening.

15. A dual damascene method, comprising:

providing a substrate, wherein a plurality of first conductive layers is formed on the substrate;

forming a first oxide layer covering the first conductive layers and the substrate, wherein the first oxide layer has protuberances respectively over the first conductive layers;

forming a mask layer covering the first oxide layer so that the mask layer also has protuberances;

performing a planarizing process to form at least a first opening exposing the first oxide layer over one of the first conductive layers, wherein the remained mask layer and the exposed first oxide layer are substantially at the same level;

forming a second oxide layer to cover the mask layer with the first opening;

patterning the second oxide layer and the first oxide layer to form a second opening which exposes the first opening and said one of the first conductive layers and to form a third opening through the second oxide layer, exposing the mask layer; and forming a second conductive layer in the first opening and the second opening to contact with said one of the first conductive layers and in the third opening.

16. A method of claim 15, wherein the first oxide layer is formed by high density plasma chemical vapor deposition.

17. A method of claim 15, wherein the planarizing process includes chemical-mechanical polishing.

* * * * *